United States Patent [19]

Mills et al.

[11] Patent Number: 5,614,313
[45] Date of Patent: Mar. 25, 1997

[54] POLYMERIC FILM HAVING A LAYER COMPRISING CALCINED SILICONE PARTICLES AND CHINA CLAY PARTICLES

[75] Inventors: Paul D. A. Mills, Darlington, England; Junaid A. Siddiqui, Richmond, Va.; Anton R. Olek, Guisborough, England

[73] Assignee: Imperial Chemical Industries PLC, London, England

[21] Appl. No.: 271,448

[22] Filed: Jul. 7, 1994

[51] Int. Cl.⁶ .................. B32B 5/16; B32B 27/06; B32B 27/36
[52] U.S. Cl. .................. 428/327; 428/325; 428/480
[58] Field of Search .................. 428/480, 325, 428/327

[56] References Cited

U.S. PATENT DOCUMENTS

| | | | |
|---|---|---|---|
| 3,980,611 | 9/1976 | Anderson et al. | 524/417 |
| 4,533,509 | 8/1985 | Gust et al. | 524/492 |
| 4,615,939 | 10/1986 | Corsi et al. | 428/323 |
| 4,654,249 | 3/1987 | Barbey et al. | 428/148 |
| 4,761,327 | 8/1988 | Hamane et al. | 428/220 |
| 4,818,581 | 4/1989 | Katoh et al. | 428/143 |
| 5,372,879 | 12/1994 | Handa et al. | 428/327 |

FOREIGN PATENT DOCUMENTS

| | | |
|---|---|---|
| 0229670 | 7/1986 | European Pat. Off. . |
| 0229670 | 7/1987 | European Pat. Off. . |
| 0604057 | 6/1994 | European Pat. Off. . |
| 2548958 | 1/1985 | France . |
| 838708 | 6/1960 | United Kingdom . |
| 1372811 | 11/1974 | United Kingdom . |

Primary Examiner—Thomas Hamilton, III
Attorney, Agent, or Firm—Cushman Darby & Cushman IP Group Pillsbury Madison & Sutro LLP

[57] ABSTRACT

A polymeric film comprising a first layer of polymeric material having on at least one surface thereof a second layer of polymeric material comprising, based upon the weight of the polymer in the second layer, (a) 0.05% to 2.0% by weight of silicone resin particles and/or calcined silicone resin particles having a volume distributed median particle diameter of 1.5 to 12.5 μm, and (b) 0.005% to 1.0% by weight of china clay particles having a volume distributed median particle diameter of 0.1 to 2.0 μm.

10 Claims, 1 Drawing Sheet

POLYMERIC FILM HAVING A LAYER COMPRISING CALCINED SILICONE PARTICLES AND CHINA CLAY PARTICLES

This invention relates to a polymeric film and in particular to a composite polymeric film.

It is known that polymeric films often have poor handling properties which may result in difficulties in winding the films into high quality reels and inefficient passage through processing, for example, slitting, equipment. There is a particular requirement of films for use in graphic arts and imaging applications to possess vacuum processing and sliding properties. By vacuum processing property is meant the ability to remove air entrapped between two films sandwiched together, or between one film and a solid support, for example in a printing frame, in a reasonable period of time. By sliding property is meant the abilty to easily slide one film over another film in order to obtain the required positioning of the respective films, but once positioned the films tend not to slide, ie to remain in the required position.

Film handling properties can be improved by increasing the surface roughness of the film, suitably by the use of coatings, or alternatively by incorporating fillers, ie organic or inorganic particles into the film. A combination of coatings and fillers may be used to improve film handling properties. The problem with using coatings to improve film handleability is that they limit the range of uses to which the film may be applied because of the difficulty in applying additional coating layers which may be required, for example, to provide antistatic, adhesion promoting or release properties.

A wide range of fillers have been incorporated into films to improve handling properties, such as glass beads, titanium dioxide, calcium carbonate, barium sulphate, silica, kaolin, zeeospheres and calcium phosphates. However, the presence of these fillers in the film results in a depreciation in the optical clarity and an increase in the haze, of the film. Combinations of fillers have been used, for example of different chemical species and/or different particle sizes, in order to optimise the required film properties. For example, British Patent No GB-1372811 discloses the use of two inert additives in different size ranges, whilst U.S. Pat. No. 3,980,611 describes a film having coarse, medium and fine particles. U.S. Pat. No. 4,654,249 discloses a polymeric film comprising a combination of kaolinire and titanium oxide particles of a certain particle size range, present at a defined concentration.

Optical clarity and transparency are important criteria in a wide range of film applications, such as packaging, metallised films, reprographic films and films for general industrial use. There is a continuing need for films exhibiting high light transmittance, low haze and excellent handling properties. One way of reducing this problem is to coat a clear base film with a thin layer of material containing a filler, which can act as an anti-blocking agent, without reducing the overall transparency of the composite film to unacceptable levels. U.S. Pat. No. 4,533,509 describes polyester films of this type.

We have surprisingly reduced or substantially overcome one or more of the aforementioned problems.

Accordingly, the present invention provides a polymeric film comprising a first layer of polymeric material having on at least one surface thereof a second layer of polymeric material comprising, based upon the weight of the polymer in the second layer, (a) 0.05% to 2.0% by weight of silicone resin particles and/or calcined silicone resin particles having a volume distributed median particle diameter of 1.5 to 12.5 µm, and (b) 0.005% to 1.0% by weight of china clay particles having a volume distributed median particle diameter of 0.1 to 2.0 µm.

The invention also provides a method of producing a polymeric film which comprises forming a first layer substrate of polymeric material having on at least one surface thereof a second layer of polymeric material comprising, based upon the weight of the polymer in the second layer, (a) 0.05% to 2.0% by weight of silicone resin particles and/or calcined silicone resin particles having a volume distributed median particle diameter of 1.5 to 12.5 µm, and (b) 0.005% to 1.0% by weight of china clay particles having a volume distributed median particle diameter of 0.1 to 2.0 µm.

The polymeric film is a self-supporting film, ie a self-supporting structure capable of independent existence in the absence of a supporting base.

The polymeric film first layer or substrate according to the invention may be formed from any synthetic, film-forming polymeric material. Suitable thermoplastics materials include a homopolymer or copolymer of a 1-olefine, such as ethylene, propylene and but-1-ene, a polyamide, a polycarbonate, and, particularly, a synthetic linear polyester which may be obtained by condensing one or more dicarboxylic acids or their lower alkyl (up to 6 carbon atoms) diesters, e.g. terephthalic acid, isophthalic acid, phthalic acid, 2,5- 2,6- or 2,7-naphthalenedicarboxylic acid, succinic acid, sebacic acid, adipic acid, azelaic acid, 4,4'-diphenyldicarboxylic acid, hexahydroterephthalic acid or 1,2-bis-p-carboxyphenoxyethane (optionally with a monocarboxylic acid, such as pivalic acid) with one or more glycols, particularly aliphatic glycols, e.g. ethylene glycol, 1,3-propanediol, 1,4-butanediol, neopentyl glycol and 1,4-cyclohexanedimethanol. A polyethylene terephthalate and/or polyethylene naphthalate first layer film is preferred. A polyethylene terephthalate first layer is particularly preferred, especially such a film which has been biaxially oriented by sequential stretching in two mutually perpendicular directions, typically at a temperature in the range 70° to 125° C., and preferably heat set, typically at a temperature in the range 150° to 250° C., for example as described in British patent 838708.

The polymeric first layer may also comprise a polyarylether or thio analogue thereof, particularly a polyaryletherketone, polyarylethersulphone, polyaryletheretherketone, polyaryletherethersulphone, or a copolymer or thioanalogue thereof. Examples of these polymers are disclosed in EP-A-1879, EP-A-184458 and U.S. Pat. No. 4,008,203. The first layer may comprise a poly(arylene sulphide), particularly poly-p-phenylene sulphide or copolymers thereof. Blends of these polymers may also be employed.

Suitable thermoset resin materials include addition—polymerisation resins—such as acrylics, vinyls, bis-maleimides and unsaturated polyesters, formaldehyde condensate resins—such as condensates with urea, melamine or phenols, cyanate resins, functionalised polyesters, polyamides or polyimides.

The polymeric film according to the invention may be unoriented, or uniaxially oriented, but is preferably biaxially oriented by drawing in two mutually perpendicular directions in the plane of the film to achieve a satisfactory combination of mechanical and physical properties. Simultaneous biaxial orientation may be effected by extruding a thermoplastics polymeric tube which is subsequently quenched, reheated and then expanded by internal gas pressure to induce transverse orientation, and withdrawn at a rate which will induce longitudinal orientation. Sequential stretching may be effected in a stenter process by extruding the thermoplastics material as a flat extrudate which is subsequently stretched first in one direction and then in the other mutually perpendicular direction. Generally, it is preferred to stretch firstly in the longitudinal direction, ie the forward direction through the film stretching machine, and then in the transverse direction. A stretched film may be, and preferably is, dimensionally stabilised by heat-setting under dimensional restraint at a temperature above the glass transition temperature thereof.

The second layer of a polymeric film according to the invention comprises any one or more of the polymeric materials hereinbefore described as being suitable for use in forming the polymeric first layer substrate. In a preferred embodiment of the invention the first and second layers comprise cystalline or semi-crystalline polymeric material, more preferably the same polymeric material, particularly a polyester, and especially polyethylene terephthalate.

Formation of the second layer on the first layer may be effected by conventional techniques—for example, by casting the polymer onto a preformed first layer. Conveniently, however, formation of a composite sheet (first and second layers) is effected by coextrusion, either by simultaneous coextrusion of the respective film-forming layers through independent orifices of a multi-orifice die, and thereafter uniting the still molten layers, or, preferably, by single-channel coextrusion in which molten streams of the respective polymers are first united within a channel leading to a die manifold, and thereafter extruded together from the die orifice under conditions of streamline flow without intermixing thereby to produce a composite sheet. A coextruded sheet is stretched to effect molecular orientation of the first, and preferably also of the second layer. In addition, the composite sheet is preferably heat-set.

Second layers may be disposed on one or both sides of the first layer. The film composites may have a total thickness in the range 10 to 500 μm, and preferably 80 to 200 μm. The or each second layer(s) suitably constitute from 1 to 25%, preferably 2 to 12%, and more preferably 3 to 8% of the total composite thickness. The second layer(s) preferably have a thickness of up to 20 μm, more preferably from 0.5 to 10 μm, and especially from 3 to 9 μm.

The silicone resin particles suitable for use in the second layer of a polymeric film according to the present invention preferably comprise a three-dimensional polymer chain structure of the formula $R_xSiO_{2-(x/2)}$ 

wherein x is greater than or equal to 1, preferably from 1 to 1.9, more preferably 1 to 1.5, and particularly 1 to 1.2. R represents an organic group, such as an aliphatic hydrocarbon, e.g. methyl, ethyl or butyl group, or an aromatic hydrocarbon, e.g. phenyl group, or an unsaturated hydrocarbon, e.g. vinyl group. In a preferred embodiment of the invention R represents a hydrocarbon group having from 1 to 8, more preferably 1 to 5 carbon atoms. In a particularly preferred embodiment of the invention R represents a methyl group. R may comprise a mixture of any two or more of the aforementioned hydrocarbon groups. Particularly preferred silicone resin particles comprise methyl sesquioxane.

The silicone resin particles suitably have a cross-linked network of siloxane linkages, comprising a mixture of the structures

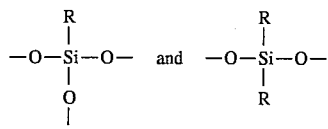

wherein R is as defined above.

Suitable silicone resin particles are commercially available, for example "Tospearl" silicone resin particles available from Toshiba Silicone Co Ltd, Japan.

Calcining of silicone resin particles results in elimination of the organic R group and hence a reduction in the value of x in the formula $R_xSiO_{2-(x/2)}$. When all the organic material has been removed x=0, and the result is silica particles ($SiO_2$).

Calcining is suitably achieved by heating the silicone resin particles at a temperature greater than 250° C., preferably from 270° C. to 650° C., more preferably from 280° C. to 500° C., particularly from 290° C. to 400° C., and especially 300° C. to 350° C. The silicone resin particles are preferably heated, prior to incorporation into the second layer polymer, for at least 1 hour, more preferably for 2 to 12 hours, particularly 3 to 8 hours, and especially 3 to 5 hours. The silicone resin particles are preferably heated in an oven in an atmosphere of air, or alternatively in a suitable inert atmosphere, such as nitrogen gas.

Elimination of the organic material during calcination of the silicone resin particles results in a reduction in weight of the particles. It is preferred that the silicone resin particles lose from 0% to 20%, more preferably up to 10%, particularly up to 5%, and especially up to 2% of the original weight thereof during the calcination process.

The calcined silicone resin particles for use in the second layer of a polymeric film according to the invention optionally contain an organic group. The ratio of organic groups, preferably methyl, to silicon atoms present in the calcined silicone resin particles is preferably in the range from 0 to 0.9:1, more preferably 0.05 to 0.7:1, particularly 0.1 to 0.5:1, and especially 0.15 to 0.3:1.

The calcined silicone resin particles suitably comprise a three-dimensional polymer chain structure of the formula $R_x(OH)_ySiO_{2-((x+y)/2)}$ 

wherein R represents an organic group as defined above for the silicone resin particles. During calcination, at least in air, elimination of the R group and formation of Si—OH bonds and additional Si—O—Si bonds occurs. There are substantially no Si—OH bonds present in the silicone resin particles prior to calcination. Further calcination results in conversion of the Si—OH bonds to Si—O—Si bonds and the eventual formation of silica particles. The value of x is preferably in the range from 0 to 0.9, more preferably 0.05 to 0.7, particularly 0.1 to 0.5, and especially 0.15 to 0.3. The value of y is preferably in the range from 0 to 1.2, more preferably from 0.2 to 1.0, particularly 0.4 to 0.8, and especially 0.5 to 0.7. The values of x and y can be determined, for example, by $^{29}Si$ magic angle spinning NMR spectroscopy.

The chemical composition of silicone resin and/or calcined silicone resin particles for use in the present invention is preferably from 80% to 100%, more preferably 90% to 99.9%, especially 92% to 98%, and particularly 94% to 97% by weight of inorganic material, and correspondingly preferably from 0% to 20%, more preferably 0.1% to 10%, especially 2% to 8%, and particularly 3% to 6% by weight of organic material. In a preferred embodiment of the invention the organic component of the resin particles comprises predominantly, and more preferably substantially, methyl groups. The inorganic component of the resin particles preferably comprises at least 98%, more preferably at least 99%, particularly at least 99.5%, and especially at least 99.9% of silica and/or hydroxylated silica, ie of silicon, oxygen and hydrogen atoms.

The volume distributed median particle diameter (equivalent spherical diameter corresponding to 50% of the volume of all the particles, read on the cumulative distribution curve relating volume % to the diameter of the particles—often referred to as the "D(v, 0.5)" value) of the silicone resin and/or calcined silicone resin particles incorporated into the second layer of a polymeric film according to the invention is in a range from 2.5 to 8.0 μm, preferably 2.8 to 5.0 μm, and especially 4.1 to 4.6 μm.

The size distribution of the silicone resin and/or calcined silicone resin particles is also an important parameter in obtaining a polymeric film having a uniform surface roughness. The resin particles suitably have a particle size distribution ratio $D_{25}/D_{75}$ (where $D_{25}$ and $D_{75}$, respectively, are the particle diameter of 25% and 75% of a volume based cumulative particle size distribution curve) value of from 1.1 to 1.6, preferably 1.15 to 1.5, more preferably 1.2 to 1.4, and especially 1.25 to 1.35. In a preferred embodiment of the invention the resin particles also have a particle size distribution ratio $D_{10}/D_{90}$ (where $D_{10}$ and $D_{90}$, respectively, are the particle diameter of 10% and 90% of a volume based cumulative particle size distribution curve) value of from 1.2 to 2.2, preferably 1.3 to 2.0, more preferably 1.5 to 1.9, and especially 1.7 to 1.8.

The presence of excessively large silicone resin and/or calcined silicone resin particles can result in the film exhibiting unsightly 'speckle', ie where the presence of individual resin particles in the film can be discerned with the naked eye. Desirably, therefore, the actual particle size of 99.9% by volume of the resin particles should not exceed 20 μm, and preferably not exceed 15 μm. Preferably at least 90%, more preferably at least 95% by volume of the resin particles are within the range of the volume distributed median particle diameter ±1.5 μm, especially ±1.0 μm and particularly ±0.5 μm.

The silicone resin and/or calcined silicone resin particles for use in the present invention are of substantially, circular cross-section irrespective of the selected viewing point. The resin particles exhibit an average aspect ratio $d_1:d_2$ (where $d_1$ and $d_2$, respectively, are the maximum and minimum dimensions of the particle) of from 1:1 to 1:0.9, preferably from 1:1 to 1:0.95, and especially from 1:1 to 1:0.98. The aspect ratio of a resin particle can be determined by measuring the $d_1$ and $d_2$ value of a resin particle selected from a photographic image obtained by using a scanning electron microscope. An average aspect ratio can be obtained by calculating the mean value of 100 typical resin particles.

In a particularly preferred embodiment of the invention, the silicone resin and/or calcined silicone resin particles have a BET specific surface area, measured as described herein, of less than 80, more preferably in the range from 3 to 50, particularly 5 to 45, and especially 15 to 40 m²/g.

The silicone resin and/or calcined silicone resin particles preferably have a skeletal density, measured as described herein, in the range from 1.95 to 2.3, more preferably 2.00 to 2.2, and particularly 2.05 to 2.15 g/cm³.

In order to obtain the advantageous properties of the present invention the concentration of silicone resin and/or calcined silicone resin particles present in the second layer is preferably in the range from 0.1% to 1.0%, more preferably 0.15% to 0.7%, particularly 0.2% to 0.5%, and especially 0.2% to 0.3% by weight based upon the weight of the polymer in the second layer.

In a preferred embodiment of the present invention the china clay particles, for incorporation in a second layer, are also calcined. Suitable china clay particles can be produced by conventional processing of hydrous clay, for example by dry milling hydrous clay, followed by air classification and purification. The clay can be subsequently calcined by heating to a temperature of at least 1000° C., and subjected to further processing by sand milling in water and forming an ethylene glycol slurry by removing the water by azeotropic distillation.

The volume distributed median particle diameter of china clay particles incorporated into the second layer of a polymeric film according to the invention is preferably in a range from 0.15 to 1.0 μm, more preferably 0.2 to 0.6 μm, and particularly 0.25 to 0.35 μm. The volume distributed median particle diameter of china clay particles is preferably less, more preferably by 3 to 5 μm, and particularly by 3.5 to 4.5 μm, than the corresponding value for the silicone resin and/or calcined silicone resin particles.

In order to obtain the advantageous properties of the present invention the concentration of china clay particles present in the second layer should be in the range from 0.01% to 0.5%, preferably 0.015% to 0.1%, and particularly 0.02% to 0.05% by weight based upon the weight of the polymer in the second layer.

Polymeric films according to the invention preferably comprise a second layer comprising 0.2% to 0.5% by weight of silicone resin and/or calcined silicone resin particles and 0.015% to 0.1% by weight of china clay particles, preferably calcined, both based upon the weight of the polymer in the second layer. In addition, the silicone resin and/or calcined silicone resin particles in the second layer preferably exhibit a volume distributed median particle diameter of 2.8 to 5.0 μm, and the china clay particles have a volume distributed median particle diameter of 0.2 to 0.6

The polymeric film of the present invention is desirably optically clear, preferably having a wide angle haze, measured as described herein, for a 100 μm thick film, of <4%, more preferably <3%, especially <2%, and particularly <1.5%.

The surface of the second layer of a polymeric film according to the invention preferably exhibits a dynamic coefficient of friction, measured as described herein, of <0.5, preferably <0.4, and particularly <0.3.

The surface of the second layer preferably exhibits a root mean square surface roughness, measured as described herein, greater than 100 nm, more preferably in the range from 120 to 350 nm, particucaly 130 to 250 nm, and especially from 140 to 200 nm.

In a particularly preferred embodiment of the invention, the surface of the second layer exhibits a Sheffield Roughness, measured as described herein, in the range from 4 to 20, more preferably 6 to 15, and particularly 8 to 13 Sheffield units.

Particle sizes of the silicone resin and/or calcined silicone resin particles and china clay particles may be measured by electron microscope, coulter counter, sedimentation analysis and static or dynamic light scattering. Techniques based on laser light diffraction are preferred for determining the particle size of filler particles. The median particle size may be determined by plotting a cumulative distribution curve representing the percentage of particle volume below chosen particle sizes and measuring the 50th percentile.

The silicone resin and/or calcined silicone resin particles and china clay particles may be added to the polymeric second layer or polymeric second layer-forming material at any point in the film manufacturing process prior to the extrusion of the polymer. For composite films comprising a polyester second layer, it is preferred to incorporate the particles as a glycol dispersion during the esterification reaction stage of the polyester synthesis.

The layers of a film according to the invention may conveniently contain any of the additives conventionally employed in the manufacture of polymeric films. Thus, agents such as dyes, pigments, lubricants, anti-oxidants, anti-blocking agents, surface active agents, slip aids, gloss-improvers, prodegradants, ultra-violet light stabilisers, viscosity modifiers and dispersion stabilisers may be incorporated in the first and/or second layer(s), as appropriate. The additives will preferably not increase the wide angle haze of the polymeric film up to or above the aforementioned values. In particular, it is preferred that the first layer substrate of a polymeric film according to the invention contains little or no filler, in order to yield a film of maximum optical properties. However, the first layer may contain relatively small quantities of filler material, preferably less than 500 ppm, more preferably less than 250 ppm, and particularly less than 125 ppm, for example due to the normal practice of using reclaimed film in the film manufacturing process.

A polymeric film according to the invention may be coated on one or both surfaces with one or more additional coating, ink, lacquer and/or metal layers, for example to form a laminate or composite which exhibits improved properties, such as antistatic, adhesion promoting or release, compared with the component materials. A preferred antistatic coating layer comprises a polychlorohydrin ether of an ethoxylated hydroxyamine and a polyglycol diamine, particularly of the type disclosed in European Patent No EP-190499. A preferred adhesion promoting layer comprises an acrylic resin by which is is meant a resin which comprises at least one acrylic and/or methacrylic component. The acrylic component is preferably present in a proportion in the range 30 to 65 mole %, and the methacrylic component is preferably present in a proportion in the range of 20 to 60 mole %. A preferred acrylic resin is derived from a monomer mixture comprising 35 to 60 mole % of ethyl acrylate/30 to 55 mole % of methyl methacrylate/2 to 20 mole % of methacrylamide, and especially comprising approximate molar proportions 46/46/8% respectively of ethyl acrylate/methyl methacrylate/acrylamide or methacrylamide, the latter polymer being particularly effective when thermoset, for example, in the presence of about 25 weight % of a methylated melamine-formaldehyde resin.

A particularly preferred polymeric film according to the invention is a multilayer film comprising, preferably consisting essentially of, in order, the following layers (i) an antistatic coating layer, (ii) a filled polymeric, preferably polyester, second layer as defined herein, (iii) an essentially unfilled polymeric, preferably, polyester, first layer, and (iv) an adhesion promoting coating layer, preferably comprising an acrylic resin as descibed herein.

Prior to the deposition of a coating medium onto the first and/or second layer, the exposed surface thereof may, if desired, be subjected to a chemical or physical surface-modifying treatment to improve the bond between that surface and the subsequently applied coating layer. A preferred treatment is corona discharge, which may be effected in air at atmospheric pressure with conventional equipment using a high frequency, high voltage generator, preferably having a power output of from 1 to 20 kw at a potential of 1 to 100 kv. Discharge is conveniently accomplished by passing the film over a dielectric support roller at the discharge station at a linear speed preferably of 1.0 to 500 m per minute. The discharge electrodes may be positioned 0.1 to 10.0 mm from the moving film surface. Alternatively, the exposed surface of the polymeric film may be pretreated with an agent known in the art to have a solvent or swelling action on the polymer layer. Examples of such agents which are particularly suitable for the treatment of a polyester film surface include a halogenated phenol dissolved in a common organic solvent e.g. a solution of p-chloro-m-cresol, 2,4-dichlorophenol, 2,4,5- or 2,4,6-trichlorophenol or 4-chlororesorcinol in acetone or methanol.

The coating medium may be applied to an already oriented polymeric film, but application of the coating medium is preferably effected before or during the stretching operation.

In particular, it is preferred that the coating medium should be applied to the first and/or second layer between the two stages (longitudinal and transverse) of a thermoplastics film biaxial stretching operation. Such a sequence of stretching and coating is especially preferred for the production of a coated polymeric film comprising a linear polyester film first layer and/or polyester second layer, which is preferably firstly stretched in the longitudinal direction over a series of rotating rollers, coated with the coating layer, and then stretched transversely in a stenter oven, preferably followed by heat setting.

Polymeric films according to the invention are suitable for use in a wide range of film applications, such as packaging, e.g. carton windows, metallised films, reprographic films and films for general industrial use. Polymeric films described herein are particularly suitable for information storage and display, such as imaging, montage, masking, stencil, overhead projection, membrane touch switch, microfilm and printing, such as thermal wax transfer printing. Films according to the invention may exhibit anti-Newton ring properties which is an important advantage in certain reprographic applications.

The invention is illustrated by reference to the accompanying drawings in which.

Figure 1:
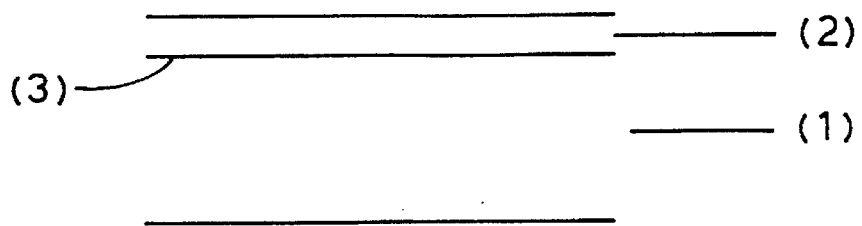
FIG. 1 is a schematic sectional elevation, not to scale, of a polymeric film having a second layer adhered directly to a first surface of a first layer substrate.

Referring to FIG. 1 of the drawings, the film comprises a polymer first layer (1) having a second layer (2) bonded to one surface (3) thereof.

Figure 2:
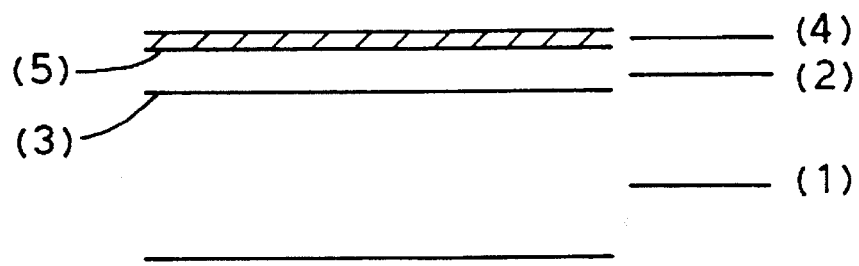
FIG. 2 is a similar schematic elevation of a polymeric film shown in FIG. 1, with an additional antistatic coating layer adhered to the surface of the second layer remote from the first layer.

The film of FIG. 2 further comprises an additional antistatic coating layer (4), adhered to the surface (5) of the second layer (2) remote from the first layer (1).

Figure 3:
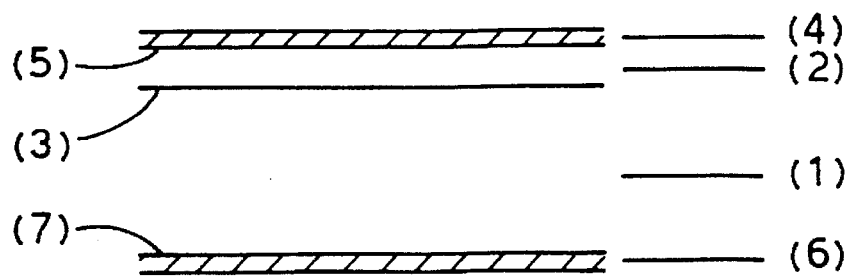
FIG. 3 is a similar schematic elevation of a polymeric film shown in FIG. 2, with an additional adhesion promoting layer adhered to the second surface of the first layer.

The film of FIG. 3 further comprises an additional adhesion promoting layer (6) adhered to the second surface (7) of the first layer (1).

In this specification the following test methods have been used to determine certain properties of the filler particles and the polymeric film:

Filler Particle Analysis

Volume distributed median particle diameter, and particle size distribution ratios $D_{25}/D_{75}$ and $D_{10}/D_{90}$ were measured using a Coulter LS130 (Coulter Electronics Ltd, Luton, UK) particle sizer.

BET specific surface area was measured by multi-point nitrogen adsorption using a Micromeritics ASAP 2400

(Micromeritics Limited, Dunstable, UK). Relative pressures between 0.05 and 0.21 were used, and the outgassing conditions were 1 hour at 140° C. with nitrogen purge (1 to 2 liters/hour).

Skeletal density was measured by helium pycnometry using a Micromeritics Accupyc 1330 (Micromeritics Limited, Dunstable, UK).

The ratio of methyl groups to silicon atoms was measured by $^{29}$Si magic angle spinning NMR spectroscopy. The spectrum was acquired on a Bruker MSL200 NMR spectrometer operating at a frequency of 39.73 MHz for $^{29}$Si. The magic angle was set using KBr and the spinning speed was 5050 Hz. The NMR free induction decay consisting of 2K complex data points was acquired using the single pulse excitation pulse sequence together with high power $^{1}$H decoupling where the $^{1}$H decoupling field was of the order of 70 kHz. The spectral width was 20 kHz, $^{29}$Si pulse length 5.5 μs (90°) and recycle delay 60 s. 1000 transients were accumulated. Data processing consisted of apodisation using an exponential with the Bruker LB parameter equal to 60 Hz, followed by Fourier transformation, phasing, baseline correction and integration using the Bruker software EP-I routine.

Polymeric Film Analysis

The dynamic coefficient of friction of the polymeric film was measured against itself by the procedure of ASTM test D 1894-87, using an Instron Universal Testing Machine (Instron, UK).

The polymeric film surface root mean square roughness was measured using a Wyko TOPO 3D Profiler (AG Electo-Optics, UK) employing a ×10 magnification objective, and run in multiple wavelength configuration using the maximum step height capability.

The Sheffield Roughness of the polymeric film surface was determined by the TAPPI test T 538 om-88, using a Sheffield Paper Gage (Giddings and Lewis, Ohio, U.S.A.)

Wide angle haze was determined as the percentage of transmitted light which deviates from the normal to the surface of the film by an average amount greater than 2.5° of arc during passage through the film, essentially according to ASTM test D 1003-61, using a Hazegard XL211 Hazemeter (BYK Gardner, U.S.).

The handling and winding properties of the film were evaluated on a slitting machine. Reels of length between 1000 m and 3000 m, and width between 500 mm and 2000 mm were slit at speeds between 50 and 400 meters per minute. The resultant slit reels were assessed for their physical appearance.

The invention is further illustrated by reference to the following Example.

EXAMPLE 1

Silicone resin particles (Tospearl 145, supplied by Toshiba Silicone Co Ltd, Japan) were calcined by heating in an oven at 300° C. for 4 hours in an atmosphere of air in order to produce filler particles for use in the present invention. The resultant calcined silicone resin particles exhibited the following characteristics which were measured using the methods described herein:
(i) volume distributed median particle diameter=4.4 μm.
(ii) particle size distribution ratio $D_{25}/D_{75}$=1.40
(iii) particle size distribution ratio $D_{10}/D_{90}$=1.85
(iv) BET specific surface area=45 m$^2$/g
(v) skeletal density=2.06 g/cm$^3$
(vi) ratio of methyl groups to silicon atoms=0.2.

A film composite comprising an unfilled polyethylene terephthalate first layer substrate and a second layer comprising polyethylene terephthalate containing approximately 0.24% by weight of calcined silicone resin particles, produced as described above, and approximately 0.03% by weight of calcined china clay particles having a volume distributed median particle diameter of 0.3 μm (RLO 3117, supplied by English China Clay International) were produced by a process of single channel coextrusion wherein streams of unfilled and filled polyethylene terephthalate supplied by separate extruders were united in a tube leading to the manifold of an extrusion die and were extruded simultaneously through the die under conditions of streamline flow and without intermixing. The film composite emerging from the extrusion die was quenched immediately upon a water-cooled rotating metal drum having a polished surface and stretched to 3.3 times its original dimension in the direction of extrusion at a temperature of about 85° C. The longitudinally stretched film was then stretched transversely in a stenter oven to 3.5 times its original dimension at a temperature of about 120° C. The film composite was finally heat set under dimensional restraint in a stenter oven at a temperature of about 225° C.

The resulting film composite consisted of a biaxially oriented and heat-set unfilled polyethylene terephthalate first layer and a filled polyethylene terephthalate second layer. Final film thickness was 100 μm, with the second layer being about 5 μm thick. The film was subjected to the test methods described above and exhibited the following characteristics:
1) Dynamic coefficient of friction of the second layer=0.25
2) Root mean square roughness of the second layer=150 nm
3) Sheffield Roughness of the second layer=10 Sheffield units
4) Haze=2%

The slit reels produced in the winding test were of excellent physical appearance. The slit reels exhibited no sign of "telescoping" or "wander", ie the ends of the reels were flat and fully normal to the cylindrical axis of the reel. The slit reels also showed no sign of pimple-like defects either on the surface or inside of the reels. The slit reels also showed no sign of a high edge at or around one or both of the slit reel ends.

We claim:

1. A polymeric film comprising a first layer of polymeric material having on at least one surface thereof a second layer of polymeric material comprising, based upon the weight of the polymer in the second layer, (a) 0.05% to 2.0% by weight of calcined silicone resin particles having a volume distributed median particle diameter of 2.5 to 12.5 μm, and (b) 0.005% to 1.0% by weight of china clay particles having a volume distributed median particle diameter of 0.1 to 2.0 μm, said second layer demonstrating a dynamic coefficient of friction of <0.5, a root mean square surface roughness greater than 100 nm and a Sheffield Roughness in the range from 4 to 20 Sheffield units, said film demonstrating a wide angle haze for a 100 μm thick film of <4%.

2. A film according to claim 1 wherein the calcined silicone resin particles comprise a three-dimensional polymer chain structure of the formula

$$R_x(OH)_y SiO_{2-((x+y)/2)}$$

wherein x is in the range from 0 to 0.9, and y is in the range from 0 to 1.2.

3. A film according to claim 1 wherein the calcined silicone resin particles have a BET specific surface area of less than 80 m$^2$/g.

4. A film according to claim 1 wherein the volume distributed median particle diameter of the calcined silicone resin particles is in the range from 2.8 to 5.0 μm.

5. A film according to claim 1 wherein the second layer comprises 0.2% to 0.5% by weight of calcined silicone resin particles.

6. A film according to claim 1 wherein the volume distributed median particle diameter of the china clay particles is in the range from 0.2 to 0.6 μm.

7. A film according to claim 1 wherein the second layer comprises 0.015% to 0.1% by weight of china clay particles.

8. A film according to claim 1 wherein at least one of the first or second layers comprises crystalline or semi-crystalline polyethylene terephthalate and/or polyethylene naphthalate.

9. A polymeric film comprising a first layer of polymeric material having on at least one surface thereof a second layer of polymeric material comprising, based upon the weight of the polymer in the second layer, (a) 0.05% to 2.0% by weight of calcined silicone resin particles having a volume distributed median particle diameter of 4.1 to 12.5 μm, and (b) 0.005% to 1.0% by weight of china clay particles having a volume distributed median particle diameter of 0.1 to 2.0 μm, said second layer demonstrating a dynamic coefficient of friction of <0.5, a root mean square surface roughness greater than 100 nm and a Sheffield Roughness in the range from 4 to 20 Sheffield units, said film demonstrating a wide angle haze for a 100 μm thick film of <4%.

10. A self-supporting polymeric film composite comprising a first layer of polymeric material having on at least one surface thereof a second layer of polymeric material comprising, based upon the weight of the polymer in the second layer, (a) 0.05% to 2.0% by weight of calcined silicone resin particles having a volume distributed median particle diameter of 1.5 to 12.5 μm, and (b) 0.005% to 1.0% by weight of china clay particles having a volume distributed median particle diameter of 0.1 to 2.0 μm wherein the first layer is unfilled polyethylene terephthalate, the second layer is polyethylene terephthalate containing, as filler, said calcined silicone resin particles and china clay particles, said unfilled and filled layers being co-extruded, biaxially oriented and heat set, said filled layer demonstrating a dynamic coefficient of friction of <0.5, a root mean square surface roughness greater than 100 nm and a Sheffield Roughness in the range from 4 to 20 Sheffield units, said film demonstrating a wide angle haze for a 100 μm thick film of <4%.

* * * * *